United States Patent
Tsai et al.

(10) Patent No.: US 10,872,980 B2
(45) Date of Patent: Dec. 22, 2020

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Wen-Che Tsai, Hsinchu (TW); Min-Yann Hsieh, Kaohsiung (TW); Hua-Feng Chen, Hsinchu (TW); Kuo-Hua Pan, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/496,067

(22) Filed: Apr. 25, 2017

(65) Prior Publication Data
US 2018/0308797 A1    Oct. 25, 2018

(51) Int. Cl.
| | | |
|---|---|---|
| *H01L 29/768* | (2006.01) | |
| *H01L 29/78* | (2006.01) | |
| *H01L 21/768* | (2006.01) | |
| *H01L 29/66* | (2006.01) | |
| *H01L 29/417* | (2006.01) | |
| *H01L 23/522* | (2006.01) | |
| *H01L 23/528* | (2006.01) | |
| *H01L 29/165* | (2006.01) | |
| *H01L 23/485* | (2006.01) | |

(52) U.S. Cl.
CPC .... *H01L 29/7851* (2013.01); *H01L 21/76804* (2013.01); *H01L 21/76831* (2013.01); *H01L 21/76897* (2013.01); *H01L 23/5226* (2013.01); *H01L 23/5283* (2013.01); *H01L 29/41766* (2013.01); *H01L 29/41791* (2013.01); *H01L 29/66545* (2013.01); *H01L 29/66795* (2013.01); *H01L 23/485* (2013.01); *H01L 29/165* (2013.01); *H01L 29/7848* (2013.01); *H01L 2029/7858* (2013.01)

(58) Field of Classification Search
None
See application file for complete search history.

(56) References Cited

U.S. PATENT DOCUMENTS

| | | | | |
|---|---|---|---|---|
| 7,397,131 B2 * | 7/2008 | Kim | ............... | H01L 21/28114 |
| | | | | 257/314 |
| 8,030,210 B2 * | 10/2011 | Wang | ............... | H01L 21/28518 |
| | | | | 257/E21.593 |
| 8,772,109 B2 | 7/2014 | Colinge | | |
| 8,785,285 B2 | 7/2014 | Tsai et al. | | |
| 8,816,444 B2 | 8/2014 | Wann et al. | | |

(Continued)

*Primary Examiner* — Abul Kalam
(74) *Attorney, Agent, or Firm* — McClure, Qualey & Rodack, LLP

(57) ABSTRACT

A semiconductor device includes a substrate, an inter-layer dielectric layer, a contact plug, and a contact hole liner. The substrate has a source/drain region. The inter-layer dielectric layer is over the substrate and has a contact hole therein. The contact plug is electrically connected to the source/drain region through the contact hole of the inter-layer dielectric layer. The contact hole liner extends between the contact plug and a sidewall of a first portion of the contact hole. The contact hole liner terminates prior to reaching a second portion of the contact hole. The first portion is between the second portion and the source/drain region.

20 Claims, 6 Drawing Sheets

(56) References Cited

U.S. PATENT DOCUMENTS

| | | |
|---|---|---|
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 9,870,943 B2 * | 1/2018 | Ko .................... H01L 29/0847 |
| 9,876,094 B2 * | 1/2018 | Bae .................... H01L 29/665 |
| 9,947,753 B2 * | 4/2018 | Hung ............... H01L 29/41725 |
| 2006/0192255 A1 * | 8/2006 | Kim ................. H01L 21/28114 |
| | | 257/382 |
| 2014/0191298 A1 * | 7/2014 | Chen .................. H01L 29/401 |
| | | 257/288 |
| 2014/0361375 A1 * | 12/2014 | Deniz ................. H01L 21/283 |
| | | 257/369 |
| 2016/0071799 A1 * | 3/2016 | Hsieh ............. H01L 21/823871 |
| | | 257/288 |
| 2016/0343825 A1 * | 11/2016 | Bae .................... H01L 29/665 |
| 2016/0351570 A1 * | 12/2016 | Park ................. H01L 27/0924 |

* cited by examiner

SEMICONDUCTOR DEVICE AND MANUFACTURING METHOD THEREOF

BACKGROUND

As the semiconductor industry has strived for higher device density, higher performance, and lower costs, problems involving both fabrication and design have been encountered. One solution to these problems has been the development of a fin-like field effect transistor (FinFET). A FinFET includes a thin vertical 'fin' on a substrate. The source, drain, and channel regions are defined within this fin. The transistor's gate wraps around the channel region of the fin. This configuration allows the gate to induce current flow in the channel from three sides.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
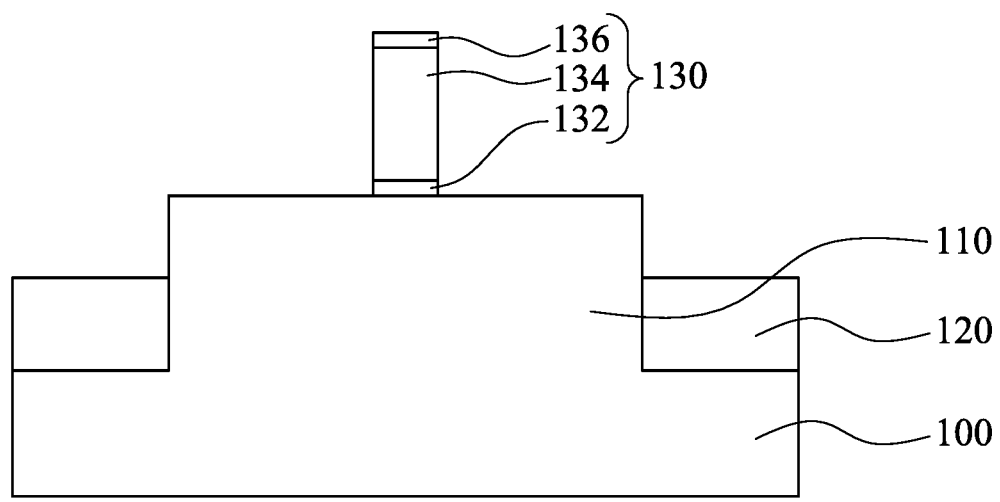
FIG. 1 to FIG. 12 are cross-sectional views of a method for manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Examples of devices that can be improved from one or more embodiments of the present application are semiconductor devices. Such a device, for example, is a Fin field effect transistor (FinFET) device. The following disclosure will continue with a FinFET example to illustrate various embodiments of the present application. The FinFET refers to any fin-based, multi-gate transistor. In some alternative embodiments, the term semiconductor device refers to a planar metal-oxide-semiconductor field effect transistor (MOSFET). Other transistor structures and analogous structures are within the contemplated scope of this disclosure. It is understood, however, that the application should not be limited to a particular type of device.

Fins in the FinFETs may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIG. 1 to FIG. 12 are cross-sectional views of a method for manufacturing a semiconductor device at various stages in accordance with some embodiments of the present disclosure.

Reference is made to FIG. 1. A fin structure 110 is formed on a semiconductor substrate 100 and protrudes from the semiconductor substrate 100. An isolation dielectric 120 is formed within the semiconductor substrate 100 to define and electrically isolate the various fins of the fin structure 110. A gate structure 130 is formed on of the fin structure 110 and exposes a portion of the fin structure 110. In some embodiments, the semiconductor substrate 100 includes silicon. Alternatively, the semiconductor substrate 100 may include germanium, silicon germanium, gallium arsenide or other appropriate semiconductor materials. Also alternatively, the semiconductor substrate 100 may include an epitaxial layer. Further, the semiconductor substrate 100 may be strained for performance enhancement. For example, the epitaxial layer may include a semiconductor material different from that of the bulk semiconductor, such as a layer of silicon germanium overlying bulk silicon or a layer of silicon overlying bulk silicon germanium. Furthermore, the semiconductor substrate 100 may include a semiconductor-on-insulator (SOI) structure. Also alternatively, the semiconductor substrate 100 may include a buried dielectric layer, such as a buried oxide (BOX) layer, such as that formed by separation by implantation of oxygen (SIMOX) technology, wafer bonding, SEG, or other appropriate method.

In some embodiments, the fin structure 110 includes silicon. The fin structure 110 may be formed, for example, by patterning and etching the semiconductor substrate 100 using photolithography techniques. In some embodiments, a layer of photoresist material (not shown) is sequentially deposited over the semiconductor substrate 100. The layer of photoresist material is irradiated (exposed) in accordance with a desired pattern (the fin structure 110 in this case) and developed to remove portions of the photoresist material. The remaining photoresist material protects the underlying material from subsequent processing steps, such as etching. It is noted that other masks, such as an oxide or silicon nitride mask, may also be used in the etching process.

In some embodiments, the isolation dielectric 120 may be shallow trench isolation (STI) and include any suitable dielectric material, such as silicon oxide, silicon nitride, silicon oxynitride, fluoride-doped silicate glass (FSG), or other low-K dielectric materials. The method of forming the isolation dielectric 120 may include depositing an isolation dielectric 120 on the semiconductor substrate 100 to cover the semiconductor fin structure 110 and trenches in the semiconductor substrate 100, optionally performing a planarization process to remove the excess isolation dielectric 120 outside the trenches, and then performing an etching process on the isolation dielectric 120 until an upper portion of the semiconductor fin structure 110 is exposed. In some embodiments, the isolation dielectric 120 may be recessed by a wet etching process or a dry etching process.

In some embodiments, the gate structure 130 is formed on the fin structure 110. The gate structure 130 has a longitudinal axis that is substantially perpendicular to a longitudinal axis of the fin structure 110. In some embodiments, the gate structure 130 can serve as a dummy gate structure and at least portions thereof will be replaced with a replacement gate structure using a "gate-last" or replacement-gate process. For example, the dummy gate structure 130 may be replaced later by metal gate electrodes (MG) after high temperature thermal processes, such as thermal annealing for source/drain activation during the sources/drains formation. In other embodiments, the gate structure 130 is an active gate and is formed in a "gate-first process" and will not be replaced.

The gate structures 130 can be formed by deposition and patterning. In some embodiments, the gate structure 130 includes a gate dielectric layer 132, a dummy gate electrode 134 with an overlaying mask layer 136. The gate dielectric layer 132 is blanket deposited on the substrate 100 by a suitable technique, such as thermal oxidation, chemical vapor deposition (CVD), physical vapor deposition (PVD), atomic layer deposition (ALD), sputtering, other suitable processes, or combinations thereof. In some embodiments, the gate dielectric layer 132 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the gate dielectric layer 132 may have a multilayer structure such as one layer of silicon oxide (e.g., interfacial layer) and another layer of high-k material.

The dummy gate electrode 134 is deposited on the gate dielectric layer 132 by a suitable technique, such as thermal oxidation, chemical vapor deposition (CVD), physical vapor deposition (PVD), atomic layer deposition (ALD), sputtering, other suitable processes, or combinations thereof. In some embodiments, the dummy gate electrode 134 may include polycrystalline-silicon (poly-Si), poly-crystalline silicon-germanium (poly-SiGe), metallic nitrides, metallic silicides, metallic oxides, or metals. In some embodiments, the dummy gate electrode 134 may include a metal-containing material such as TiN, TaN, TaC, Co, Ru, Al, combinations thereof, or multi-layers thereof.

The mask layer 136, such as photoresists, hard masks, combinations thereof, or multi-layers thereof, may be formed over the dummy gate electrode 134. Then, the mask layer 136 is patterned by a lithography process and an etching process, thereby forming openings in the mask layer 136, exposing the underlying dummy gate electrode layer within the openings. The lithography process may include photoresist (or resist) coating (e.g., spin-on coating), soft baking, mask aligning, exposure, post-exposure baking, developing the photoresist, rinsing, drying (e.g., hard baking), other suitable processes, and/or combinations thereof. The etching process includes dry etching, wet etching, and/or other etching methods (e.g., reactive ion etching). Another etching process is applied to the dummy gate electrode layer and the gate dielectric layer through the openings of the mask layer 136, thereby forming the dummy gate structure 130 straddling portions of the fin structure 110 as shown in FIG. 1.

Figure 2:
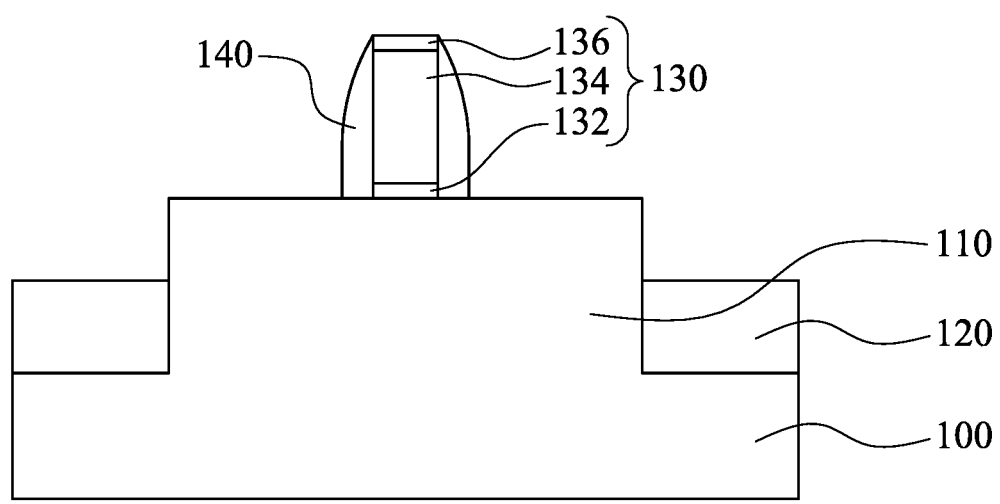

Reference is made to FIG. 2. Gate spacers 140 are formed on sidewalls of the gate structure 130. In some embodiments, the gate spacers 140 may include silicon oxide, silicon nitride, silicon oxynitride, silicon carbide, silicon carbonitride, silicon oxycarbonitride, silicon oxycarbide or other suitable material. The gate spacers 140 may include a single layer or multilayer structure. To form the gate spacers 140, a blanket layer may be formed on the substrate 100 by CVD, PVD, ALD, or other suitable technique. In some embodiments, the gate spacers 140 are used to offset subsequently formed doped regions, such as source/drain regions. The gate spacers 140 may further be used for designing or modifying the source/drain region (junction) profile.

Figure 3:
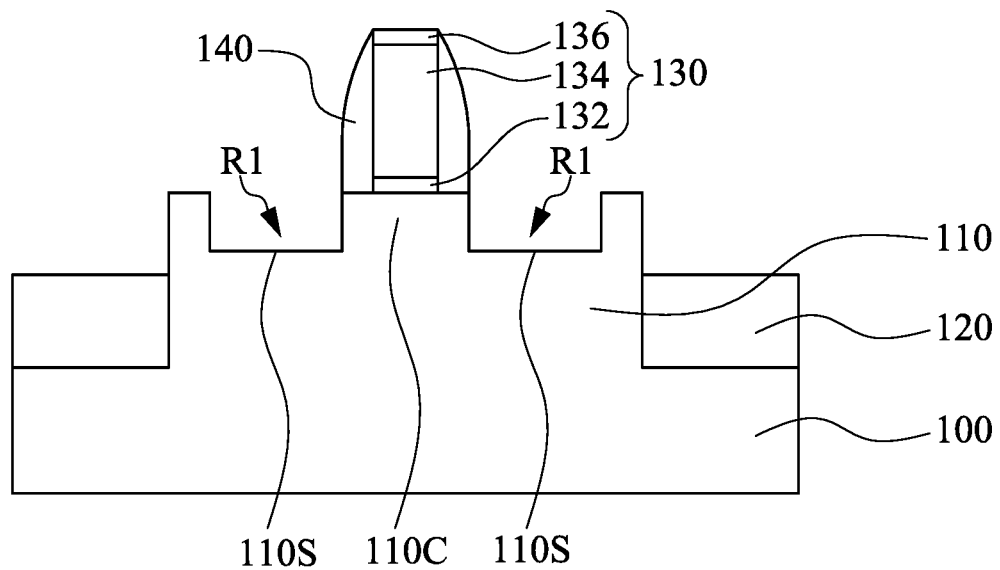

Reference is made to FIG. 3. Portions of the semiconductor fin structure 110 uncovered by the gate structure 130 and the gate spacers 140 are removed (or recessed) to form source/drain recesses R1 in the semiconductor substrate 100. A remaining portion of the semiconductor fin structure 110 has source/drain portions 110S and at least one channel portions 110C. The channel portion 110C underlies the gate structure 130, and the source/drain portions 110S are not covered by the dummy gate structure 130 and the gate spacers 140.

Figure 4:
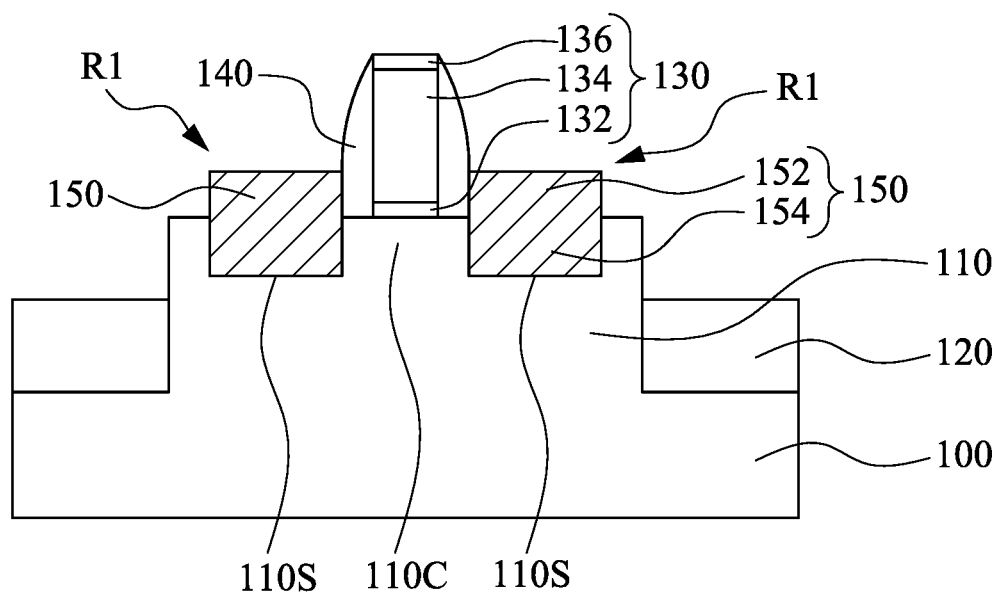

Reference is made to FIG. 4. Epitaxy features 150 (also referred to as source/drain regions) are formed within the recesses R1 and on the source/drain portions 110S of the semiconductor fin structure 110. In some embodiments, the epitaxy features 150 may include raised portions 152 and embedded portions 154 underlying the respective raised portions 152. The raised portions 152 are raised above the fin structure 110, and the embedded portions 154 are embedded in the fin structure 110. In some embodiments, the epitaxy features 150 may be formed using one or more epitaxy or epitaxial (epi) processes, such that Si features, SiGe features, SiP features, and/or other suitable features can be formed in a crystalline state on the source/drain portions 110S of the semiconductor fin structure 110. In some embodiments, the lattice constants of the epitaxy features 150 are different from the lattice constant of the fin structure 110, so that the channel portion 110C of the fin structure 110 can be strained or stressed by the epitaxy features 150 to improve carrier mobility of the semiconductor device and enhance the device performance. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the fin structure 110.

Figure 5:
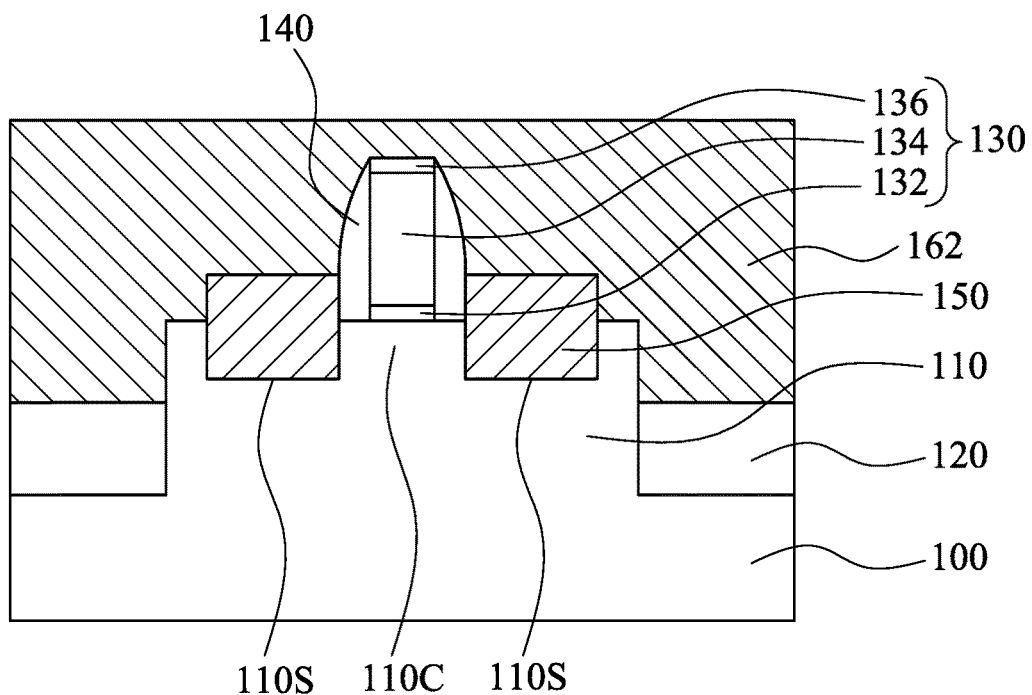
Figure 6:
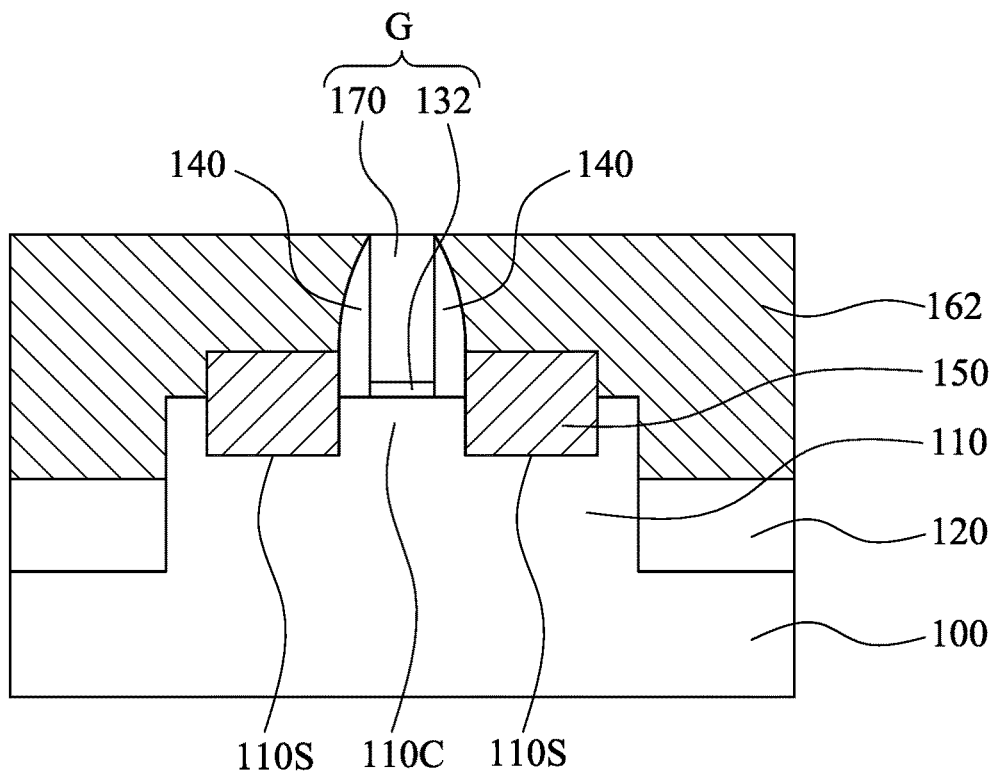

Reference is made to FIG. 5. A first inter-layer dielectric (ILD) layer 162 is formed over the substrate 100. The first ILD layer 162 includes silicon oxide, silicon nitride, silicon oxynitride, silicon carbide, low-dielectric constant dielectric material or a combination thereof. The first ILD layer 162 includes a single layer or multiple layers. The first ILD layer 162 is formed by a suitable technique, such as CVD. Subsequently, a chemical mechanical planarization (CMP) process is applied to remove excessive first ILD layer 162 until the mask layer 136 is removed, and the resulting structure is shown in FIG. 6. In other words, the first ILD layer 162 is removed to expose a top surface of the dummy gate electrode 134 for a subsequent gate replacement process.

Thereafter, the gate replacement process is performed to replace the dummy gate structure 130 with a gate electrode 170 (or gate conductors). More particularly, dummy gate electrode 134 of the dummy gate structure 130 is removed to form a gate trench with the gate spacers 140 as its sidewall, and the gate electrode 170 is formed in the gate trench. In some embodiments, the gate dielectric layer 132 is removed as well. The dummy gate electrode 134 may be removed by dry etch, wet etch, or a combination of dry and wet etch. For example, a wet etch process may include exposure to a hydroxide containing solution (e.g., ammonium hydroxide), deionized water, and/or other suitable etchant solutions.

In some embodiments, the gate electrode 170 and the underlying gate dielectric layer 132 can be collectively referred to as a gate stack G, as shown in FIG. 6. The gate feature G straddles the semiconductor fin structure 110 and extends along the gate spacers 140. In some embodiments, the gate electrode 170 includes a work function conductor and a filling conductor in a recess of the work function conductor. For example, the work function conductor of the gate electrode 170 may include one or more n-type work function metals (N-metal), such as titanium aluminide (TiAl), titanium aluminum nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. Alternatively, the work function conductor may include one or more p-type work function metals (P-metal), such as titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. In some embodiments, the filling conductor of the gate electrode 170 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Figure 7:
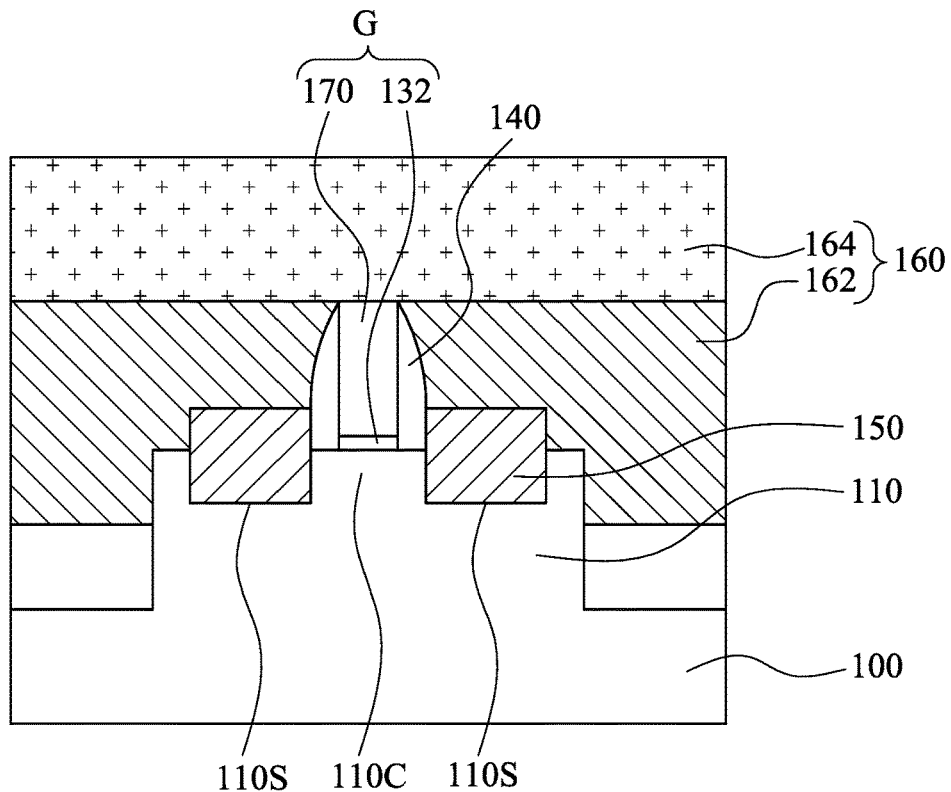

Reference is made to FIG. 7. A second ILD layer 164 is formed on the first ILD layer 162 and the gate electrode 170. The first ILD layer 162 and the second ILD layer 164 can be collectively referred to as an ILD structure 160. The second ILD layer 164 may include substantially the same materials as first ILD layer 162 in some embodiments. In some embodiments, the first and second ILD layers 162 and 164 have different dielectric materials. In some embodiments, the second ILD layer 164 includes silicon oxide, silicon nitride, silicon oxynitride, silicon carbide, low-dielectric constant dielectric material or a combination thereof. The second ILD layer 164 includes a single layer or multiple layers. The second ILD layer 164 is formed by a suitable technique, such as CVD.

Figure 8:
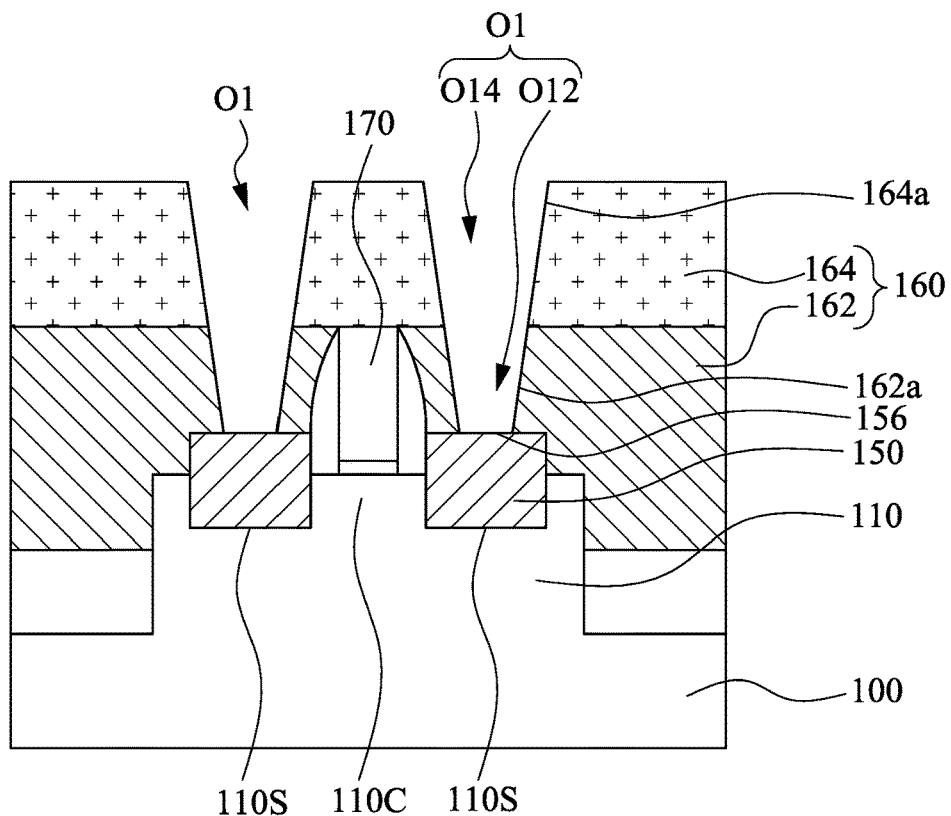

Reference is made to FIG. 8. Contact holes O1 are formed in the ILD structure 160 to expose portions of the epitaxy features 150. In other words, contact holes O1 are etched in the first ILD layer 162 and the second ILD layer 164 until reaching the epitaxy features 150. The contact hole O1 has a lower portion O12 and an upper portion O14 in communication with each other, the lower portion O12 is defined by sidewalls 162a of the first ILD layer 162, the upper portion O14 is defined by sidewalls 164a of the second ILD layer 164, and a width of the lower portion O12 is less than that of the upper portion O14. In some embodiments, the contact holes O1 are respectively formed in opposite sides of the gate electrode 170. In some embodiments, the contact holes O1 taper in a direction toward the semiconductor substrate 100.

In some embodiments, the contact holes O1 may be formed, for example, by patterning and etching the first ILD layer 162 and the second ILD layer 164 using photolithography techniques. A layer of photoresist material (not shown) is sequentially deposited over the second ILD layer 164. The layer of photoresist material is irradiated (exposed) in accordance with a desired pattern (the contact holes in this case) and developed to remove portions of the photoresist material. The remaining photoresist material protects the underlying material from subsequent processing steps, such as etching. The etching process, such as a dry etching, wet etching, and/or plasma etching process, is performed to remove portions of the first ILD layer 162 and the second ILD layer 164. In some embodiments, the etching process may be, but not limited to be, anisotropic etching.

Figure 9:
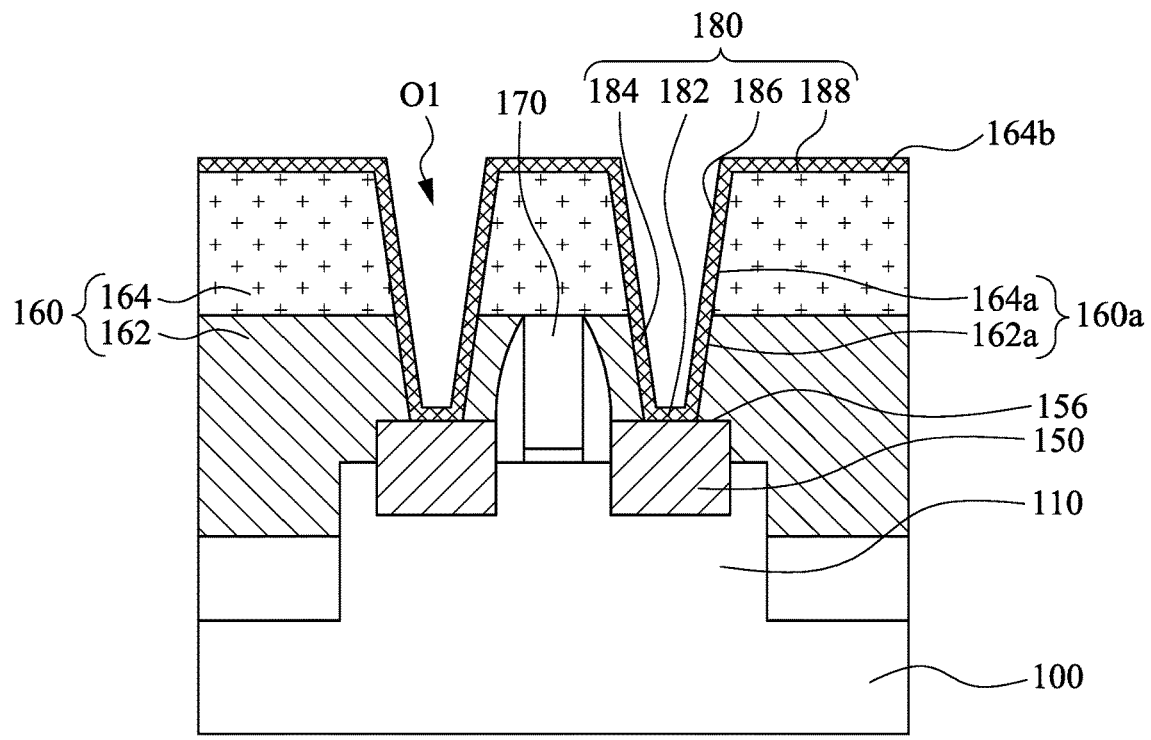

Reference is made to FIG. 9. A contact hole liner 180, also referred to as a dielectric protection layer, is formed in the contact holes O1. The contact hole liner 180 conformally lines the sidewalls of the ILD structure 160 (including the sidewalls 162a of the first ILD layer 162 and the sidewalls 164a of the second ILD layer 164) and the top surface 156 of the epitaxial feature 150. State differently, the contact hole liner 180 conformally lines confines of the contact holes O1 and is in contact with the sidewalls 162a and 164a of the ILD structure 160. The contact hole liner 180 includes a bottom portion 182, a first portion 184, a second portion 186 and a top portion 188 monolithically connected to each other. The bottom portion 182 is in contact with the top surface 156 of the epitaxy feature 150, and the top portion 188 is in contact with a top surface 164b of the second ILD layer 164. The first portion 184 is in contact with the sidewalls 162a of the first ILD layer 162 in the contact holes O1, and the second portion 186 is disposed over the first portion 184 and in contact with the sidewalls 164a of the second ILD layer 164. In some embodiments, the contact hole liner 180 may be formed in the contact holes O1 by a suitable technique, such as chemical vapor deposition (CVD), physical vapor deposition (PVD), atomic layer deposition (ALD) other suitable processes, or combinations thereof. In some embodiments, the contact hole liner 180 may include dielectric materials such as hafnium oxide (HfO2), silicon nitride (SiN), silicon carbide (SiC), aluminum nitride (AlN), aluminum oxide ($Al_2O_3$), or high-k dielectric materials.

Figure 10:
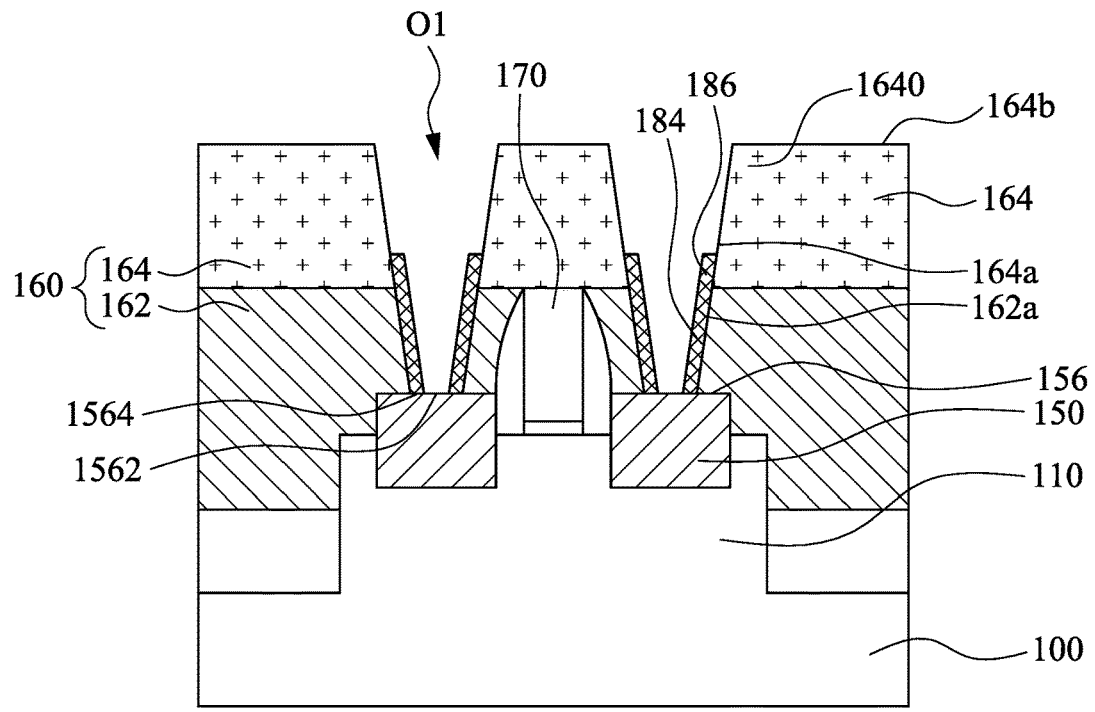

Reference is made to FIG. 10. A Portion of the contact hole liner 180 is removed to expose portions of sidewalls of the ILD structure 160. As shown in FIG. 9 and FIG. 10, in some embodiments, the bottom portion 182, the top portion 188, and an upper portion of the second portion 186 of the contact hole liner 180 are removed by an etching process, such as a dry etching, a wet etching, and/or other etching methods (e.g., reactive ion etching). In some embodiments, the etching process includes reacting an etchant with the contact hole liner 180, in which the etchant has high selectivity between the second ILD layer 164 and the contact hole liner 180. In other words, the second ILD layer 164 and the contact hole liner 180 have different etch resistance properties. For example, the second ILD layer 164 has higher etch resistance to the etchant used to etch the contact hole liner 180 than that of the contact hole liner 180.

The etching process conditions, such as, time, temperature, concentration, performed to etch the contact hole liner 180 are well controlled, such that the first portion 184 remains lining the sidewalls 162a of the first ILD layer 162, so the remaining first portion 184 may prevent shorts between the gate electrode 170 and subsequently formed contact plug, which will be discussed later. In some embodiments, the first portion 184 and a remaining portion of the second portion 186 connected to the first portion 184 may respectively remain on the sidewalls 162a and 164a, as shown in FIG. 10. Alternatively, in some embodiments, the second portion 186 is totally removed, while the first portion 184 remains on the sidewalls 162a of the ILD structure 160. In some embodiments, a portion of the first portion 184 is removed to expose a portion of the sidewall 162a.

Figure 11:
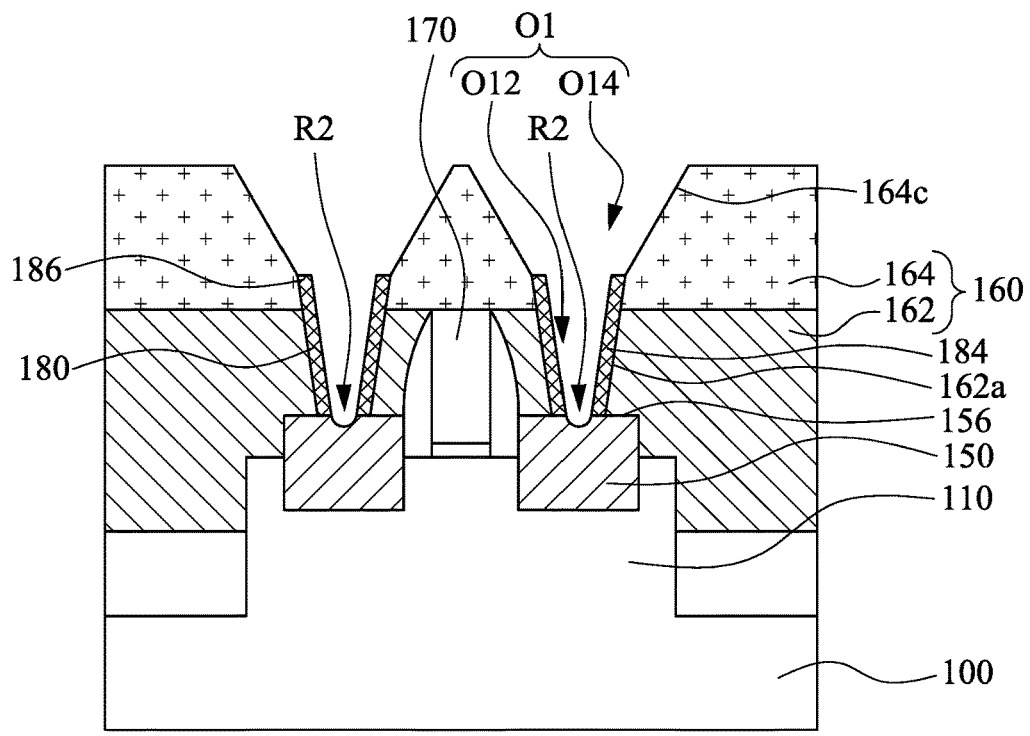

The top surface 156 of the epitaxy feature 150 has a first region 1562 and a second region 1564. The first region 1562 is free from being covered by the contact hole liner 180, and the second region 1564 is covered by the contact hole liner 180. The first region 1562 of the epitaxy feature 150 is recessed to form a contact recess R2, and the second region 1564 is not recessed due to the protection of the contact hole liner 180. The resulting structure is shown in FIG. 11. A sidewall of the recess R2 coincides with a sidewall of the remaining contact hole liner 180. In some embodiments, the contact recesses R2 may have a substantially rounded or U-shaped profile.

In some embodiments, the contact recesses R2 may be formed, for example, by etching the epitaxy feature 150. In some embodiments, during the etching operation performed in FIG. 10, unwanted byproducts, such as unwanted polymer, generated from this etching operation will fall on the top surface 156 of the epitaxy feature 150. These unwanted byproducts would adversely affect the etching of the contact recess R2. Therefore, in some embodiments, the epitaxy feature 150 can be cleaned, for example, by a plasma ashing process, such as a gamma ashing process, so that the unwanted byproducts can be removed from the top surface 156 of the epitaxy feature 150. An oxygen etch is one type of reactive species in the plasma ashing, and various embodiments may use other types of plasma ashing, such as fluorine. In some embodiments, the plasma ashing process may be performed, for example, using reactive plasma with a flouroboric acid such as carbon tetrafluorides ($CF_4$). Alternatively, a clean process may be performed for clean residue of the plasma away by applying acid liquid, such as ACT690, to the epitaxy feature 150.

In some embodiments, during etching the contact recesses R2, portions of the second ILD layer 164 are removed. In other words, the exposed sidewall of the second ILD layer 164 is etched during the etching process of the contact recess R2 in the epitaxy feature 150. As a result, a top portion of the contact hole O1 is expanded. In some embodiments, the second ILD layer 164 and the contact hole liner 180 have different etch resistance properties. For example, the contact hole liner 180 has higher etch resistance to the etchant used to etch the contact recesses R2 than that of the second ILD layer 164.

In some embodiments, the expanded contact hole O1 includes a first portion O12 and a second portion O14 in communication with each other, and the first portion O12 is between the epitaxy feature 150 and the second portion O14. The first portion O12 is defined by the remaining contact hole liner 180, and the second portion O14 is defined by the remaining second ILD layer 164. In other words, the contact hole liner 180 terminates prior to reaching the sidewall of the second portion O14 of the contact hole O1 (or the sidewall of the second ILD layer 164). In some embodiments, the second portion O14 of the contact hole O1 is expanded due to etching of the sidewall of the second ILD layer 164.

In some embodiments, because the first ILD layer 162 is protected from the etching the contact recess R2 by the contact hole liner 180, a slope of the sidewall 162a of the first ILD layer 162 is different from a slope of the exposed sidewall 164c of the second ILD layer 164. State differently, sidewalls of the first portion O12 and the second portion O14 of the contact hole O1 have different slopes. The remaining contact hole liner 180 conformably lines the sidewalls 162a of the first ILD layer 162, so a slope of the remaining contact hole liner 180 is substantially equal to the slope of the sidewall 162a of the first ILD layer 162, and thus the slope of the remaining contact hole liner 180 is different from that of the sidewall 164c of the exposed second ILD layer 164. In other words, a sidewall of the remaining contact hole liner 180 has a slope different from a slope of the sidewall of the second portion O14 of the contact hole O1. In some embodiments, for example, the slope of the sidewall of the remaining contact hole liner 180 is greater than that of the sidewall of the second portion O14. In some embodiments, for example, the slope of the sidewall of the remaining contact hole liner 180 is greater than that of the sidewall 164c of the exposed second ILD layer 164. State differently, the sidewall of the first portion O12 of the contact hole O1 has a slope greater than a slope of the sidewall of the second portion O14 of the contact hole O1.

Figure 12:
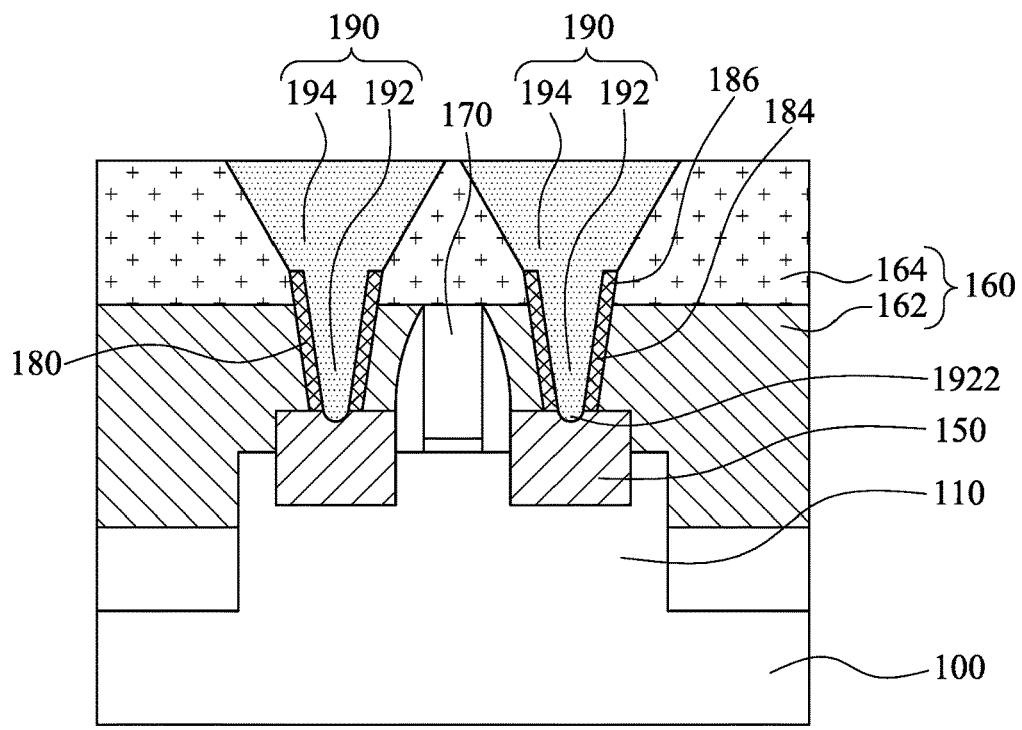

Next, conductive features, such as contact plugs 190, are formed in the contact holes O1 and the contact recesses R2, and are in contact with the epitaxy features 150. The resulting structure is shown in FIG. 12. Exemplary formation method of the contact plugs 190 may include depositing metal or other suitable conductive materials in the contact holes O1 by a deposition process, such as a CVD process, to form the contact plugs 190. The contact plugs 190 can thus serve as source/drain contacts. The contact plug 190 tapers in a direction toward the substrate 100. More particularly, the contact plug 190 has a bottom portion 192 and an overlying top portion 194 monolithically connected to each other. The bottom portion 192 of the contact plug 190 fills the contact recess R2 and the first portion O12 of the contact hole O1, and the top portion 194 of the contact plug 190 fills the second portion O14 of the contact hole O1.

In some embodiments, as shown in FIG. 12, the bottom portion 192 of the contact plug 190 is separated from gate electrode 170. More particularly, the bottom portion 192 of the contact plug 190 is separated from the ILD structure 160 (i.e. the first ILD layer 162) by the remaining contact hole liner 180. The remaining contact hole liner 180 extends between the contact plug 190 and the sidewall of the first portion O12 of the contact hole O1. In other words, the remaining contact hole liner 180 extends along a sidewall of the bottom portion 192 of the contact plug 190 and terminates prior to reaching the top portion 194 of the contact plug 190. Since the remaining contact hole liner 180 is present between the bottom portion 192 of the contact plug 190 and the ILD structure 160, the remaining contact hole liner 180 can reduce a risk of causing unwanted shorts between the contact plug 190 and the gate electrode 170.

In some embodiments, the bottom portion 192 of the contact plug 190 has an extension 1922 in the recess R2 and in contact with the epitaxy feature 150. The extension 1922 is embedded in the epitaxy feature 150, which can increase a contact area between the contact plug 190 and the epitaxy feature 150. In some embodiments, for example, the extension 1922 may have, but it not limited to have, a substantially rounded or U-shaped profile.

In some embodiments, as shown in FIG. 11 and FIG. 12, the top portion 194 of the contact plug 190 is in contact with the ILD structure 160 (such as the second ILD layer 164). In other words, the top portion 194 of the contact plug 190 fills the second portion O14 of the contact hole O1. That is, the second ILD layer 164 encloses the top portion 194 of the contact plug 190, and the contact hole liner 180 is absent on sidewalls of the top portion 194 of the contact plug 190. In some embodiments, a sidewall of the top portion 194 of the contact plug 190 has a slope different from a slope of a sidewall of the bottom portion 192 of the contact plug 190. In some embodiments, the top portion 194 tapers in a direction toward the substrate 100. In some embodiments, for example, the slope of the sidewall of the bottom portion 192 of the contact plug 190 is greater than that of the top portion 194. In other words, the sidewall of the bottom portion 192 is steeper than the sidewall of the top portion 194.

Embodiments of the present disclosure have following advantages. The contact hole liner can protect the gate stack from etching the recess in the epitaxy feature, and hence unwanted shorts between the gate stack and the contact plug can be prevented. Moreover, the contact hole liner terminates prior to reaching an upper sidewall of the contact hole, and hence the upper portion of the contact hole can be expanded during etching the recess in the epitaxy feature. Such expansion of the contact hole is advantageous to form a large contact plug therein, and hence the contact resistance between the contact plug and the epitaxy feature can be reduced.

According to some embodiments, a semiconductor device includes a substrate, an inter-layer dielectric layer, a contact plug, and a contact hole liner. The substrate has a source/drain region. The inter-layer dielectric layer is over the substrate and has a contact hole therein. The contact plug is electrically connected to the source/drain region through the contact hole of the inter-layer dielectric layer. The contact hole liner extends between the contact plug and a sidewall of a first portion of the contact hole. The contact hole liner terminates prior to reaching a second portion of the contact hole. The first portion is between the second portion and the source/drain region.

According to some embodiments, a semiconductor device includes a substrate, an epitaxy feature, a contact plug, a dielectric protection layer, and an inter-layer dielectric layer. The epitaxy feature is on the substrate. The contact plug is over the epitaxy feature. The dielectric protection layer extends along a sidewall of a first portion of the contact plug. The dielectric protection layer terminates prior to reaching a second portion of the contact plug. The first portion is between the second portion and the epitaxy feature. The inter-layer dielectric layer encloses the contact plug.

According to some embodiments, a method of manufacturing a semiconductor device includes forming a source/drain region on a substrate, forming a dielectric layer over the source/drain region, forming a contact hole in the dielectric layer, forming a contact hole liner in the contact hole, removing a first portion of the contact hole liner to expose a sidewall of the contact hole, etching the exposed sidewall of the contact hole, and forming a contact plug in the contact hole.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a substrate having a source/drain region;
    an inter-layer dielectric structure over the substrate and comprising a first inter-layer dielectric layer and a second inter-layer dielectric layer over the first inter-layer dielectric layer;
    a contact plug through the inter-layer dielectric structure and having a stepped sidewall structure comprising an upper sloped sidewall, a lower sloped sidewall steeper than the upper sloped sidewall, and an intermediary surface connecting the lower sloped sidewall to the upper sloped sidewall, wherein a width of the contact plug is wider than a width of the source/drain region; and
    a contact hole liner between the contact plug and the inter-layer dielectric structure and having a top surface in a position higher than a top surface of the first inter-layer dielectric layer and lower than a top surface of the second inter-layer dielectric layer, wherein the contact hole liner is capped by the contact plug and is in contact with a top surface of the source/drain region, the contact plug has a bottom portion extending from the contact hole liner into the source/drain region, and the intermediary surface of the stepped sidewall structure is entirely in contact with the contact hole liner.

2. The semiconductor device of claim 1, further comprising:
    a gate conductor over the substrate, the contact hole liner being between the gate conductor and the contact plug.

3. The semiconductor device of claim 1, wherein a sidewall of the contact hole liner has a slope different from a slope of a sidewall of the inter-layer dielectric structure.

4. The semiconductor device of claim 3, wherein the sidewall of the inter-layer dielectric structure extends upwardly from a top of the sidewall of the contact hole liner.

5. The semiconductor device of claim 1, wherein the inter-layer dielectric structure has a first sidewall and a second sidewall extending upwardly from a top of the first sidewall, and the first sidewall and the second sidewall have different slopes.

6. The semiconductor device of claim 5, wherein the slope of the first sidewall is greater than the slope of the second sidewall.

7. The semiconductor device of claim 1, wherein the contact hole liner and the inter-layer dielectric structure have different etch resistance properties.

8. The semiconductor device of claim 1, wherein the contact hole liner is in contact with a sidewall of the inter-layer dielectric structure.

9. The semiconductor device of claim 1, wherein the bottom portion of the contact plug has a rounded profile.

10. The semiconductor device of claim 1, wherein the source/drain region has a concave surface in contact with the bottom portion of the contact plug.

11. The semiconductor device of claim 1, wherein the bottom portion of the contact plug and the source/drain region form a curved interface.

12. The semiconductor device of claim 1, wherein a top surface of the contact hole liner is lower than a top surface of the contact plug.

13. A semiconductor device, comprising:
a substrate;
an epitaxy feature on the substrate;
a contact plug over the epitaxy feature and having a stepped sidewall structure comprising a lower sloped sidewall passing through a top surface of the epitaxy feature, an upper sloped sidewall, and an intermediary surface connecting the lower sloped sidewall to the upper sloped sidewall;
a dielectric protection layer extending along the lower sloped sidewall of the contact plug and capped by the intermediary surface of the contact plug;
a first inter-layer dielectric (ILD) layer enclosing the lower sloped sidewall of the stepped sidewall structure the contact plug; and
a second inter-layer dielectric (ILD) layer over the first ILD layer and enclosing the upper sloped sidewall of the stepped sidewall structure of the contact plug, wherein the intermediary surface of the stepped sidewall structure of the contact plug forms an interface with the dielectric protection layer at a level higher than an interface formed by the first and second ILD layers.

14. The semiconductor device of claim 13, wherein a sidewall of the dielectric protection layer has a slope steeper than a slope of the upper sloped sidewall of the contact plug.

15. The semiconductor device of claim 13, wherein the lower sloped sidewall of the contact plug is steeper than the upper sloped sidewall of the contact plug.

16. The semiconductor device of claim 13, wherein the epitaxy feature has a recess filled by the contact plug, and wherein a sidewall of the recess extends downwardly from a bottom of a sidewall of the dielectric protection layer.

17. A semiconductor device, comprising:
a semiconductor fin protruding above a substrate;
a gate electrode over the semiconductor fin;
an epitaxy structure at least partially embedded in the semiconductor fin;
a contact plug having a top end that overlaps the gate electrode and having a bottom end that is surrounded by the epitaxy structure; and
a dielectric protection layer surrounding the contact plug and capped by the contact plug, wherein the dielectric protection layer and a topmost surface of the epitaxy structure forms an interface at a level higher than a top surface of the semiconductor fin.

18. The semiconductor device of claim 17, further comprising:
a gate spacer between the gate electrode and the dielectric protection layer; and
a first inter-layer dielectric layer having a portion between the gate spacer and the dielectric protection layer.

19. The semiconductor device of claim 18, further comprising:
a second inter-layer dielectric layer over the first inter-layer dielectric layer, wherein an interface between the first and second inter-layer dielectric layers adjoins the dielectric protection layer.

20. The semiconductor device of claim 17, wherein the contact plug has a first sidewall covered by the dielectric protection layer and a second sidewall free from coverage by the dielectric protection layer, and the first sidewall and the second sidewall have different slopes.

* * * * *